United States Patent [15] 3,665,342

Reed [45] May 23, 1972

[54] RESONANT CIRCUIT TRANSISTOR OSCILLATOR SYSTEM

[72] Inventor: L. J. Reed, Mesa, Ariz.

[73] Assignee: Motorola, Inc., Franklin Park, Ill.

[22] Filed: Nov. 4, 1970

[21] Appl. No.: 86,685

[52] U.S. Cl. ............................331/109, 331/75, 331/117 R, 331/183, 331/186

[51] Int. Cl. ........................................H03b 3/02, H03b 5/12

[58] Field of Search ................331/75, 109, 117 R, 183, 185, 331/186, 116 R, 168, 159

[56] References Cited

UNITED STATES PATENTS 3,461,400 8/1969 Koda.............................331/117 R X

*Primary Examiner*—Roy Lake
*Assistant Examiner*—Siegfried H. Grimm
*Attorney*—Mueller and Aichele

[57] ABSTRACT

An oscillator including a bias source which may be applied to a chip by integrated circuit techniques is disclosed. The oscillator has a tank circuit for determining frequency and has an automatic gain control for keeping the amplitude of the oscillator output constant. The oscillator includes an output circuit which makes it possible to use the oscillator as a source of input waves for an emitter coupled logic circuit.

8 Claims, 1 Drawing Figure

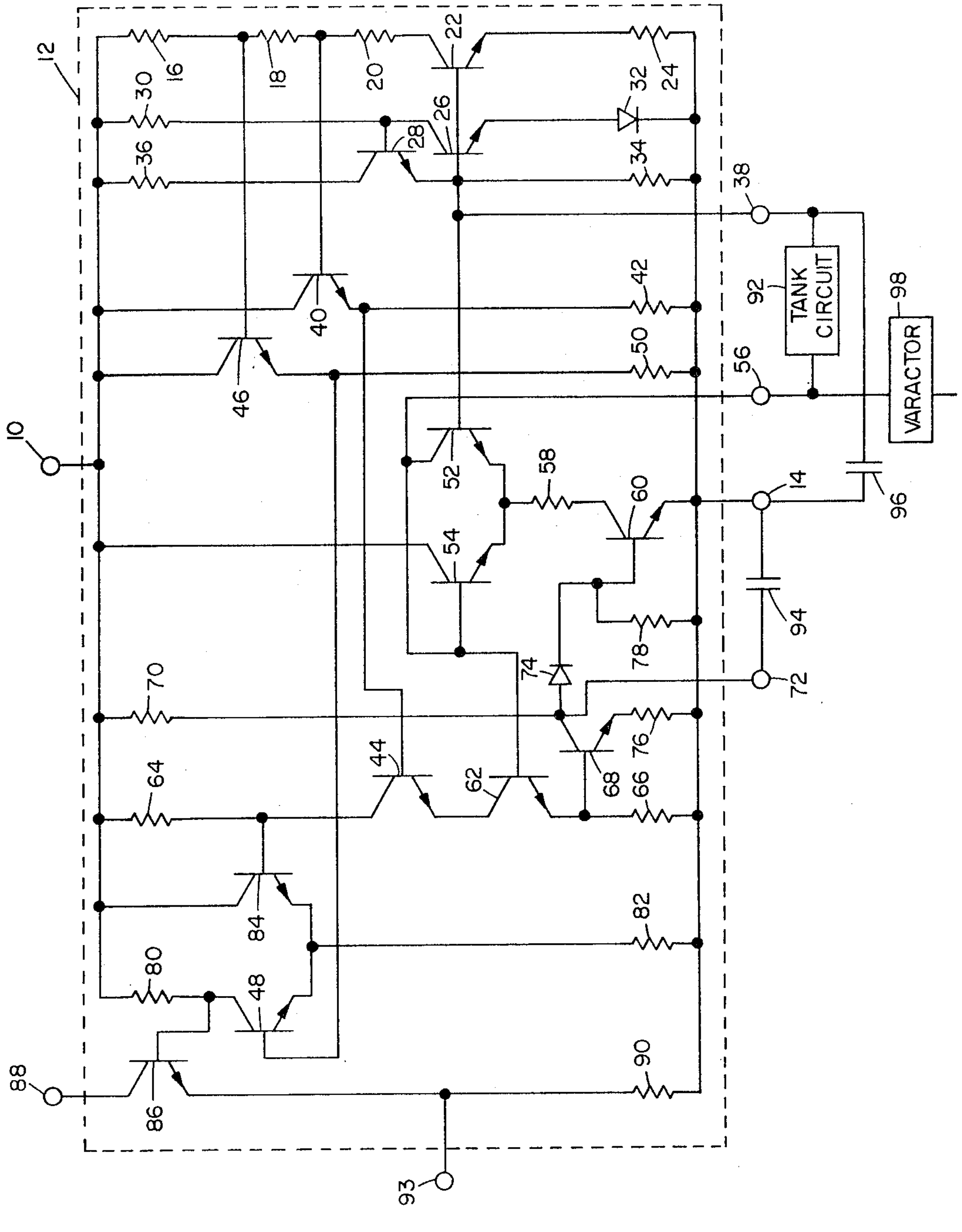
INVENTOR.
L.J. Reed
BY
Mueller & Aichele
ATTY'S.

RESONANT CIRCUIT TRANSISTOR OSCILLATOR SYSTEM

BACKGROUND

Oscillator means are necessary to produce oscillations which may be used as clock pulses or for other purposes in the operation of a logic circuit. The oscillations produced must have the wave shape, usually square, the voltage excursions and the mean voltage with respect to ground required by the logic circuit to which the oscillator is to be coupled. Furthermore, so that the completed oscillator and its output coupling circuit need not take up much space and be reproducible accurately and inexpensively, the oscillator and its coupling circuit must be adapted to be put on a chip by known methods.

It is an object of this invention to provide an oscillator, a bias and an output coupling circuit therefor, which are adapted to be put on a chip. It is another object of this invention to provide an oscillator whose output is of the wave shape and of the amplitude, peak to peak, as well as the mean amplitude to ground, required to match a predetermined logic circuit.

SUMMARY

In accordance with the invention, an oscillator is provided comprising transistors, resistors and diodes which, except for the tank circuit and for filter capacitors, may be applied to a chip. Also applied to the chip is a circuit means providing bias currents for the oscillator and a circuit means for providing a constant amplitude of output oscillations as well as a circuit to which the waves provided by the oscillator is applied, shaping the applied waves and determining the excursion thereof, and determining the peak voltage thereof with respect to a reference voltage, and producing a matching output and also preventing reaction by the load on the oscillator to thereby prevent changing the frequency or amplitude of the produced waves by the load connected to the oscillator circuit.

DESCRIPTION

The invention will be better understood upon reading the following specification in connection with the accompanying drawing, the sole FIG. of which illustrates a circuit embodying the invention.

Turning to the FIG., the positive terminal of a source of voltage (not shown) may be connected to the supply input terminal 10 of a chip 12 whose outline is indicated in dotted lines. The other terminal of the supply voltage may be connected to the terminal 14, which may also be the ground connection for chip 12. While only one ground connection is shown, as many thereof as is desired may be provided.

Three resistors 16, 18 and 20 are connected in series in the order named between the terminal 10 and the collector of an NPN transistor 22. Since all transistors shown in the Figure are of the NPN type, no further designation of the type of transistors mentioned hereinafter will be given. The emitter of the transistor 22 is connected to the terminal 14 by way of a resistor 24. The base of the transistor 22 is connected to the base of a transistor 26 whose collector is connected to the base of a transistor 28 and also to the terminal 10 by way of a resistor 30. The emitter of the transistor 26 is connected to the anode of a diode 32, the cathode of the diode 32 being connected to the terminal 14. The base of the transistor 26 is connected to the emitter of the transistor 28 and also to the terminal 14 by way of a resistor 34. The collector of the transistor 28 is connected to the terminal 10 by way of resistor 36. The junction of the emitter of the transistor 28 and the resistor 34 is a bias point, as will be explained, and is connected to a bias terminal 38.

The collector of a transistor 40 is connected directly to the terminal 10. The base of the transistor 40 is connected to the junction of the resistors 18 and 20. The emitter of the transistor 40 is connected to the terminal 14 by way of a resistor 42 and also to the base of the transistor 44.

The collector of a transistor 46 is connected directly to the terminal 10, its base is connected to the junction of the resistors 16 and 18, and its emitter is connected to the base of a transistor 48 and also to the terminal 14 by way of a resistor 50.

The collector of a transistor 52 is connected to the base of a transistor 54 and also to a tank terminal 56 of the chip 12. The base of the transistor 52 is connected to the base of the transistor 26. The emitters of the two transistors 52 and 54 are connected together and through a resistor 58 to the collector of a transistor 60 whose emitter is connected to the terminal 14. The collector of the transistor 54 is connected to the terminal 10. The base of the transistor 54 is also connected to the base of a transistor 62.

The collector of the transistor 44 is connected to the terminal 10 by way of a resistor 64. The emitter of the transistor 44 is connected to the collector of the transistor 62. The emitter of the transistor 62 is connected to the terminal 14 by way of a resistor 66. The emitter of the transistor 62 is also connected to the base of a transistor 68. The collector of the transistor 68 is connected to the terminal 10 by way of a resistor 70, to an automatic gain control (hereinafter agc) terminal 72 and to the anode of a diode 74. The emitter of the transistor 68 is connected to the terminal 14 by way of a resistor 76. The cathode of the diode 74 is connected to the terminal 14 by way of a resistor 78 and to the base of the transistor 60.

The collector of the transistor 48 is connected to the terminal 10 by way of a resistor 80. The emitter of the transistor 48 is connected by way of a common-emitter resistor 82, to the terminal 14. The emitter of the transistor 48 is also connected directly to the emitter of a transistor 84 whose collector is connected directly to the terminal 10 and whose base is connected to the collector of the transistor 44.

The collector of an output transistor 86 is connected directly to a supply terminal 88. While two supply terminals 10 and 88 are shown, only one thereof need be provided since the collector of the transistor 86 may be connected to the terminal 10. The base of the transistor 86 is connected to the collector of the transistor 48 and the emitter of the transistor 86 is connected by way of a load resistor 90 to the terminal 14. The oscillatory output of the chip 12 may be taken from the output terminal 93 which is connected to the emitter of the transistor 86.

Other elements of the circuit which are not on the chip are now described. These elements may comprise a tank circuit 92, which may take the form of a parallel connected inductance and capacitance, and which is connected between the tank terminal 56 and the bias terminal 38. These elements also may include bypass or filter capacitors 94 and 96, which are connected respectively between the agc terminal 72 and the bias terminal 38 to the supply terminal 14.

Explaining the operation of the described circuit, it will be noted that the transistor 46 and its emitter resistor 50 as well as the elements on the chip to the right thereof as viewed in the Figure are the direct current portion of the chip 12 and the elements to the left are the oscillator and output portion thereof. Since the described oscillator is to be a source of square waves for a system of emitter coupled logic, the output thereof must have the correct wave shape and correct voltage swing, and its impedance must be proper for coupling to the emitter coupled logic circuit.

The source applied to the terminal 10 with respect to the terminal 14 will normally be voltage regulated. The coupling together of the bases of the transistors 22 and 26 and the low and constant voltage drop in the forward direction thereof of the diode 32 and of the base to emitter junction of the transistor 26, makes the voltage at the terminal 38 two diode drops above the supply terminal 14 and makes the voltage at the junction of the resistors 16 to 18, and 18 to 20 constant at a value determined by these resistances. The connection of the emitter of the transistor 28 to the base of the transistor 52 makes the bias point 38 of low impedance but at a constant voltage of two diode drops above the potential of the terminal 14 as stated. By way of the tank circuit 92, the potential at the bias terminal 38 is applied to the collector of the transistor 52 and to the bases of the transistors 54 and 62, the bias on the bases of these transistors 54 and 62 thereby being two diode drops above terminal 14. By choice of the resistors 16 and 50, the base of the transistor 48 is one-and-a-half diode drops below the terminal 10. In a similar manner, the bias level for the base of the transistor 44 is fixed at two diode drops below the terminal 10 by choice of the resistors 16, 18 and 42. Due to the connection of the bases of the transistors 44 and 48 to the emitters of respective transistors 40 and 46, these bias sources exhibit low impedance. The capacitor 96 acts as a filter capacitor and keeps alternating components out of the bias source.

Due to the connection of the tank circuit 92 between the collector and base of the transistor 52 and due to the connection between the emitters of the transistors 52 and 54 and the connection of the collector of the transistor 52 to the base of the transistor 54, feed, both forwards and backwards between these transistors results whereby when the tank circuit 92 is connected as described, an oscillator is provided. The frequency of this oscillator may vary from nearly direct current to very high frequency up to more than 250 megacycles, depending on the tuning of the tank circuit 92. If desired, one terminal of a varactor, a voltage variable capacitor 98, may be coupled to the tank terminal 56, whereby the produced wave may be varied or modulated in frequency in accordance with the voltage applied at the other terminal of the varactor 98.

Automatic gain control is provided by the described oscillator. The output of the oscillator which includes the transistor 54 is taken from the base thereof and applied to the base of the transistor 62 which acts as an emitter follower transistor. The swing of the transistor base 62 causes a swing of the emitter thereof and therefore of the current flow in the resistor 66, causing a swing in the base of the transistor 68. The base of the transistor 68 is biased at one diode drop above the terminal 14, due to the connection of the bias point 38 which is up two diode drops to the base of the transistor 68 by way of the base to emitter path of the transistor 62. Therefore, the transistor 68 is normally non-conductive. The alternating current supply applied to the base of the transistor 68 is converted into direct current by the rectifier action of the transistor 68 and filtering action of the capacitor 94, whereby a steady direct voltage appears at the collector of the transistor 68 which depends in amplitude on the amplitude of the oscillations appearing at the base of the transistor 54. When the transistor 68 is off, bias current is supplied to the base of the transistor 60 from the terminal 10 by way of the resistor 70 and diode 74. This renders the transistor 60 conductive, whereby current flows through the transistor 52 or 54, whereby they can produce oscillations, that is current will flow alternately either in the transistor 52 or 54 when the transistor 60 is conductive. When the amplitude of the oscillations at the base of the transistor 54 goes up high enough to make the transistor 68 conductive, less base current flows into the transistor 60, reducing the conductivity of the transistor 60, to reduce the current flow through the transistors 52 and 54. In fact, the current flow through the transistors 52 and 54 may be reduced to zero if the voltage at the base of the transistor 54 goes too high. In this manner the amplitude of the oscillations produced by the described oscillator is kept constant. This amplitude is independent of the size of the capacitor 94 and depends on the ratio of the resistors 70 and 76.

The output of the oscillator should not be loaded by the load applied thereto to prevent reaction of the load on the oscillator amplitude or frequency. This is accomplished by taking the output of the oscillator from the base of the transistor 54 and applying it to the base of the transistor 62. Nor should the voltage applied to the collector of the transistor 62 vary, since such variations would change the base to emitter capacity of the transistor 62 thereby lowering the gain of the transistor 62 and increasing the load on the tank circuit 92. This lack of voltage change is accomplished by the use of the transistor 44, connected in a cascade relation to the transistor 62. Since the base of the transistor 44 is kept at a constant potential by its connection to the emitter of the transistor 40, a bias point, and since the base to emitter voltage of the transistor 44 is constant, the voltage at the collector of the transistor 62 cannot vary whereby no additional capacity (of the transistor 62) is applied to the base of the transistor 54 and no additional load is reflected thereby into the tank circuit 92 to cause frequency degradation.

Furthermore the output of the oscillator should be square, its excursion and the maximum voltage thereof should be that required by the load connected to the output terminal 93. As stated above, the resistor 82 is connected as a common-emitter resistor, whereby the transistors 48 and 84 share the current through it. At no signal input to the base of the transistor 84, the base of transistors 84 and 48 are one-and-one-half diode drops below the voltage applied at the terminal 10. The voltage at the base of the transistor 48 remains constant, that of the base of the transistor 84 varies with the oscillator voltage. As the current through the resistor 64 goes up and down above and below the one-and-one-half diode drops below the supply voltage at the terminal 10, due to the oscillator output voltage at the base of the transistor 62, the transistor 84 goes off and on respectively. When the transistor 84 is on, the transistor 48 is off and vice-versa. Excursions of the oscillation output voltage on the base of transistor 84 in the negative direction beyond cut-off of the transistor 84 cannot further increase the current in the transistor 48 and excursions of the oscillator output voltage on the base of the transistor 84 in the positive direction cannot decrease the current flow in the transistor 48 after its current has reached zero. Therefore, as long as the oscillatory output voltage is great enough to cause the transistor 84 to go from non-conductivity to the conductivity point where there is no current for the transistor 48, then the output at the base of the transistor 86 is square and its amplitude is determined by the transistors 48, 84 and their connections and not by the oscillator output at the base of the transistor 62. The maximum voltage at the collector of the transistor 48 and therefore the base of the transistor 86 approaches the voltage at the supply terminal 88. The ratio of the resistors 80 and 82 determines the amplitude of the square wave at the base of the transistor 86. Common-emitter resistor 82, because of the differential action of transistors 48 and 84, acts like a source of constant current.

Furthermore, the output must be matched to the load to be applied to the terminal 93. This is accomplished by the emitter follower output transistor 86 and the emitter resistor 90. The transistor 86 drops the voltage at the base one diode drop and also acts as an emitter follower current amplifier. The output 93 is of the required low impedance and the voltage swing of the output is that required and the voltage swings about a bias level of about one-and-one-half diode drops below the voltage at the terminal 14 due to the current flow in the resistor 80, thereby being adapted to match an emitter coupled logic circuit.

While the circuit elements and their connections, except for elements 92, 94, 96 and 98 have been described as being on a chip, discrete elements may be used. While only NPN transistors have been described, the transistors may be PNP with proper polarity of the source.

What is claimed is:

1. An oscillator system having a bias portion for supplying a bias voltage, an oscillator portion and an automatic gain control system for the oscillator portion, the oscillator portion and the automatic gain control system comprising:

a first and a second transistor, each having a first and a second main electrode, and each having a control electrode, the first main electrodes being electrically connected together;

means for connecting the electrical connection between the first main electrodes between the first and second transistors to one side of a source of electrical power;

means for connecting the second main electrode of the first transistor directly to the control electrode of the second transistor;

means for connecting the second main electrode of the second transistor to the other side of the source of electrical power;

means for connecting a frequency determining means directly between the second main electrode of the first transistor and the control electrode of the first transistor;

means for applying the bias voltage directly to the control electrode of the first transistor and indirectly through the frequency determining means to the second main electrode of the first transistor and the control electrode of the second transistor;

a third and fourth transistor, each having a first and second main electrode, and each having a control electrode;

means for connecting the control electrode of the second transistor to the control electrode of the third transistor;

means for connecting the first main electrode of the third transistor to the one side of the source of electrical power and the second main electrode to the other side of the source of electrical power;

means for coupling the first main electrode of the third transistor to the control electrode of the fourth transistor; and the means for connecting the electrical connection of the first main electrodes of the first and second transistors to one side of a source of electrical power, further comprising the first main electrode of the fourth transistor being connected to the one side of the source of electrical power and the second main electrode being connected to the electrical connection.

2. The invention of claim 1 in which means are provided to keep the second main electrode of said third transistor at a constant voltage.

3. The invention of claim 1 in which said means for coupling the first electrode of said third transistor to the control electrode of said fourth transistor includes a fifth transistor and a diode connected between a main electrode of said fifth transistor and the control electrode of said fourth transistor.

4. The invention of claim 1 in which a voltage limiting means is provided for said oscillation portion, said voltage limiting means including a sixth and a seventh transistor each having a first and second main electrode and a control electrode and a common-emitter resistor, the first electrode of each of said sixth and seventh transistors being connected by way of the common-emitter resistor to the one side of the source of electrical power, means for applying a fixed bias from said bias portion to the control electrode of said seventh transistor, means for connecting the second main electrode of the sixth transistor to the other side of the source of electrical power, means for applying oscillator output from the control electrode of said second transistor to the control electrode of the said sixth transistor and means to take limited output voltage from the second electrode of said seventh transistor.

5. The invention of claim 4 in which said means for applying an oscillator output from the control electrode of said second transistor to the control electrode of said sixth transistor comprises the path through the main electrodes of one transistor, the control electrode thereof being supplied with a constant voltage, and through a main electrode and the control electrode of another transistor.

6. The invention of claim 1 in which said bias portion comprises an eighth and ninth transistor each having first and second main electrodes and a control electrode, and a diode, means to connect the first main electrode of said ninth transistor to the one side of the source of electrical power by way of the forward conductor direction of said diode, means to connect the second main electrode of the ninth transistor to the other side of the source of electrical power, means to connect the second main electrode of the eighth transistor to the other side of the source of electrical power, and means to connect said control electrodes of said eighth and ninth transistors together, said control electrode of said first transistor being connected to said control electrode of said eighth and ninth transistors.

7. The invention of claim 6 in which the means for connecting the second main electrode of the eighth transistor further comprise:

a plurality of resistors connected in series and means are provided for providing bias potential comprising connections to the junctions of said series connected resistors.

8. The invention of claim 7 in which said means for providing bias includes a further transistor, having first and second main electrodes and a control electrode, the control electrode of the further transistor being connected to a junction of the series connected resistors and the bias being taken from the first main electrode of said further transistor, the second main electrode being connected to the other side of the source of electrical power.

* * * * *